United States Patent
Ng et al.

(10) Patent No.: US 6,642,152 B1
(45) Date of Patent: Nov. 4, 2003

(54) METHOD FOR ULTRA THIN RESIST LINEWIDTH REDUCTION USING IMPLANTATION

(75) Inventors: Che-Hoo Ng, San Martin, CA (US); Scott Bell, San Jose, CA (US); Anne Sanderfer, Campbell, CA (US); Christopher Lee Pike, Vancouver, WA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 150 days.

(21) Appl. No.: 09/812,206

(22) Filed: Mar. 19, 2001

(51) Int. Cl.[7] .............................................. H01L 21/302
(52) U.S. Cl. ..................... 438/717; 438/514; 438/558
(58) Field of Search ................. 438/705, 717, 438/725, 669, 514, 558, 694; 430/5

(56) References Cited

U.S. PATENT DOCUMENTS

| | | | | |
|---|---|---|---|---|
| 4,253,888 A | * | 3/1981 | Kikuchi ....................... 438/514 |
| 4,321,317 A | * | 3/1982 | MacIver ........................ 430/5 |
| 4,557,797 A | * | 12/1985 | Fuller et al. ................. 438/514 |
| 4,963,501 A | * | 10/1990 | Ryan et al. ................... 438/183 |
| 5,139,904 A | | 8/1992 | Auda et al. ................... 430/30 |
| 5,431,770 A | | 7/1995 | Lee et al. ................. 156/653.1 |
| 5,804,088 A | * | 9/1998 | McKee ........................ 216/47 |
| 5,841,179 A | | 11/1998 | Pramanick et al. ......... 257/437 |
| 5,876,903 A | | 3/1999 | Ng et al. ..................... 430/313 |
| 5,963,841 A | | 10/1999 | Karlsson et al. ............. 438/952 |
| 5,965,461 A | | 10/1999 | Yang et al. .................. 438/717 |
| 6,020,269 A | | 2/2000 | Wang et al. ................. 438/717 |
| 6,200,903 B1 | * | 3/2001 | Oh et al. ..................... 438/705 |
| 6,492,068 B1 | * | 12/2002 | Suzuki .......................... 430/5 |

OTHER PUBLICATIONS

Wolf et al. "Silicon Processing for the VLSI Era", Lattice press, vol. 1, p. 581.*
Badih "Fundamentals of Semiconductor Processing Technologies", Kluwer Academic pub., p. 365.*

* cited by examiner

Primary Examiner—Kin-Chan Chen
(74) Attorney, Agent, or Firm—Amin & Turocy, LLP

(57) ABSTRACT

The present invention relates to a system and a method for reducing the linewidth of ultra thin resist features. The present invention accomplishes this end by applying a densification process to an ultra thin resist having a thickness of less than about 2500 Å formed over a semiconductor structure. In one aspect of the present invention, the method includes providing a semiconductor substrate having a device film layer formed thereon. An ultra thin resist is then deposited over the device film layer. The ultra thin resist is patterned according to a desired structure or feature using conventional photolithography techniques. Following development, the ultra thin resist is implanted with a dopant. After the implantation is substantially completed, the device film layer is anisotropically etched.

35 Claims, 14 Drawing Sheets

METHOD FOR ULTRA THIN RESIST LINEWIDTH REDUCTION USING IMPLANTATION

TECHNICAL FIELD

The present invention relates to semiconductor processing and, more particularly, to a system and method for reducing the linewidth of ultra thin resist features by implanting the ultra thin resist.

BACKGROUND OF THE INVENTION

In the semiconductor industry, there is a continuing trend toward higher device densities. To achieve these high densities there has been and continues to be efforts toward scaling down the device dimensions on semiconductor wafers (e.g., at submicron levels). In order to accomplish such high device packing density, smaller and smaller features sizes are required. This may include the width and spacing of interconnecting lines, spacing and diameter of contact holes and the surface geometry such as corners and edges of various features.

The requirement of small features with close spacing between adjacent features requires high resolution photolithographic processes. In general, lithography refers to processes for pattern transfer between various media. It is a technique used for integrated circuit fabrication in which a silicon slice, the wafer, is coated uniformly with a radiation-sensitive film, the resist and an exposing source (such as optical light, x-rays, etc.) illuminates selected areas of the surface through an intervening master template, the mask, for a particular pattern. The lithographic coating is generally a radiation-sensitive coating suitable for receiving a projected image of the subject pattern. Once the image is projected, it is indelibly formed in the coating. The projected image may be either a negative or a positive image of the subject pattern. Exposure of the coating through a photomask causes the image area to become either more or less soluble (depending on the coating) in a particular solvent developer. The more soluble areas are removed in the developing process to leave the pattern image in the coating as less soluble polymer.

The ability to reduce the size of computer chips is driven by lithography technology which, in turn, relies upon decreasing the wavelength of the radiation used in the technology. Currently, 248 nm radiation is widely used in manufacturing while 193 nm radiation is being explored in research and development. Future lithography technologies may progress to 157 nm radiation or even lower wavelengths such as those used in extreme ultra-violet (EUV) lithography (11–13 nm).

As the wavelength of the radiation decreases, organic-based photoresist materials become increasingly opaque to the radiation. This effect necessitates the use of ultra thin resist (UTR) coatings to maintain the desired characteristics of the masked photoresist structures, including maintaining maximum exposure and focus latitude of the masked photoresist structures as well as near vertical sidewalls for the resist profiles. Ultra thin resist coatings, as described here, are generally considered to be resist films of less than 2500 Å in thickness. This compares to conventional lithographic processes which use resist film thicknesses of more than 5000 Å for 248 nm lithography and about 4000 Å for 193 nm lithography.

A conventional lithographic trim process utilizing a resist film having a thickness less than 2500 Å is outlined in FIG. 1. FIGS. 2–6 illustrate a structure 20 undergoing the process 10. In FIG. 2, the structure 20 comprising a semiconductor substrate 22, a device film 24 and a hard mask 28 is shown. FIG. 3 corresponds to a step 12 (FIG. 1) in which a resist layer 32 is deposited over the hard mask 28. The resist layer 32 has a thickness of greater than 2500 Å. FIG. 4 illustrates a step 14 (FIG. 1) in which the resist layer 32 as shown in FIG. 3 is patterned using a photomask 40 and incident radiation 36. The resist layer 32 shown in FIG. 4 has been substantially etched and developed. In FIG. 5, the resist layer 32 has been isotropically etched as prescribed by step 16 (FIG. 1). As indicated by the dashed line, the linewidth of the resist layer 32 has been decreased as a result of the isotropic etch process. Once the hard mask 28 and the device film 24 have been etched and developed, the structure 20 in FIG. 6 is obtained. The decreased size of the etched resist layer 32 following the isotropic etch (trim) leads to smaller, but highly flawed or imperfect structures.

Several problems still exist with conventional trim processes. For example, although device films can be scaled down and the selectivity of the etch process can be improved, the increasing use of trim processes can fully consume the etch process margin for the underlying film because some of the resist is consumed during the trim step (leaving less for etching the film). In particular, ultra thin resist coatings can pose problems during etch processes because the device films needing to be etched often do not scale as rapidly as the thickness of the resist coating. In addition, ultra thin resist films do not planarize underlying device topology. The implication of ultra thin resist over topography is that the resist is thinnest over "high" areas and thickest over "low" areas. Naturally, the etch process will be limited by the areas where the resist is thinnest.

Thus, it is a recognized problem that ultra thin resist coatings have little process latitude for current trim etch methods due to the inherently thin resist. In addition, there is no known method for reducing the linewidth of ultra thin resist features without compromising selectivity between the resist and the underlying layer (e.g., device film layer) during the etch operation. Therefore, it would be desirable to have a method for reducing the linewidth of ultra thin resist features without compromising selectivity between the resist and the underlying layer during the etch process. Furthermore, it would be desirable to have such a method that reduces manufacturing costs while improving precision and operating speed.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention relates to a system and a method for reducing the linewidth of ultra thin resist features formed on a wafer. The present invention accomplishes this end by applying a densification process to an ultra thin resist having a thickness of less than about 2500 Å formed over a semiconductor structure. The densification process involves an implantation step, wherein the ultra thin resist is implanted with a dopant before being used to etch an underlying layer. The implantation densifies the ultra thin resist and improves etch selectivity of ultra thin resists relative to underlying layers. Following implantation, current or conventional trim (isotropic etching) techniques may be used to further reduce the ultra thin resist linewidth.

The amount of linewidth reduction varies with the degree of densification. The degree of densification may be controlled by implant parameters such as the dopant species, dose, degree of tilt from normal orientation (i.e., incident angle to normal vector of the wafer plane or degree normal to the wafer plane) and energy level employed. Thus, the densification process facilitates controlled linewidth reduction of features formed on ultra thin resist films having a thickness of less than 2500 Å. This improved precision yields increased operating speeds and leads to reduction in manufacturing costs as well.

In one aspect of the present invention, the method includes providing a semiconductor substrate having a device film layer formed thereon. An ultra thin resist is then deposited over the device film layer. The ultra thin resist is patterned according to a desired structure or feature using conventional photolithography techniques. Following development, the ultra thin resist is implanted with a dopant. After implantation is substantially completed, the device film layer is anisotropically etched and patterned.

In another aspect, the invention provides a method for forming a semiconductor structure having controlled linewidth reduction. The method includes providing a semiconductor substrate having a device film layer formed thereon. An ultra thin resist is then deposited over the device film layer. An image or pattern of a desired structure or feature is transferred to the ultra thin resist using a photomask and conventional photolithography techniques. The ultra thin resist is then implanted with a dopant. Following implantation, the implanted ultra thin resist is isotropically etched (trimmed). After the implanted ultra thin resist is trimmed, the underlying device film layer is anisotropically etched and patterned.

In yet another aspect, the invention provides a method for forming a semiconductor structure having controlled linewidth reduction. The method includes providing a semiconductor substrate having a device film layer formed thereon and an etch stop layer formed over the device film layer. An image or pattern of a desired feature is transferred to the ultra thin resist using a photomask and conventional photolithography techniques. The ultra thin resist is then implanted with a dopant. Following implantation of the ultra thin resist, the hard mask is isotropically etched. The etch stop layer is then anisotropically etched. Following, the device film layer is anisotropically etched and patterned.

In still another aspect, the present invention provides a semiconductor structure having a controlled linewidth reduction containing a means for depositing an ultra thin resist over a semiconductor substrate having a device film layer formed thereon; a means for transferring a desired structure image to the ultra thin resist; a means for implanting the ultra thin resist with a dopant; and a means for anisotropically etching and patterning the device film layer.

The invention extends to features hereinafter fully described and features particularly pointed out in the claims. The following detailed description and the annexed drawings set forth in detail certain illustrative examples of the invention. These examples are indicative of but a few of the various ways in which the principles of the invention may be employed. Other ways in which the principles of the invention may be employed and other objects, advantages and novel features of the invention will be apparent from the detailed description of the invention when considered in conjunction with the drawings.

DETAILED DESCRIPTION OF THE INVENTION

Figure 1:
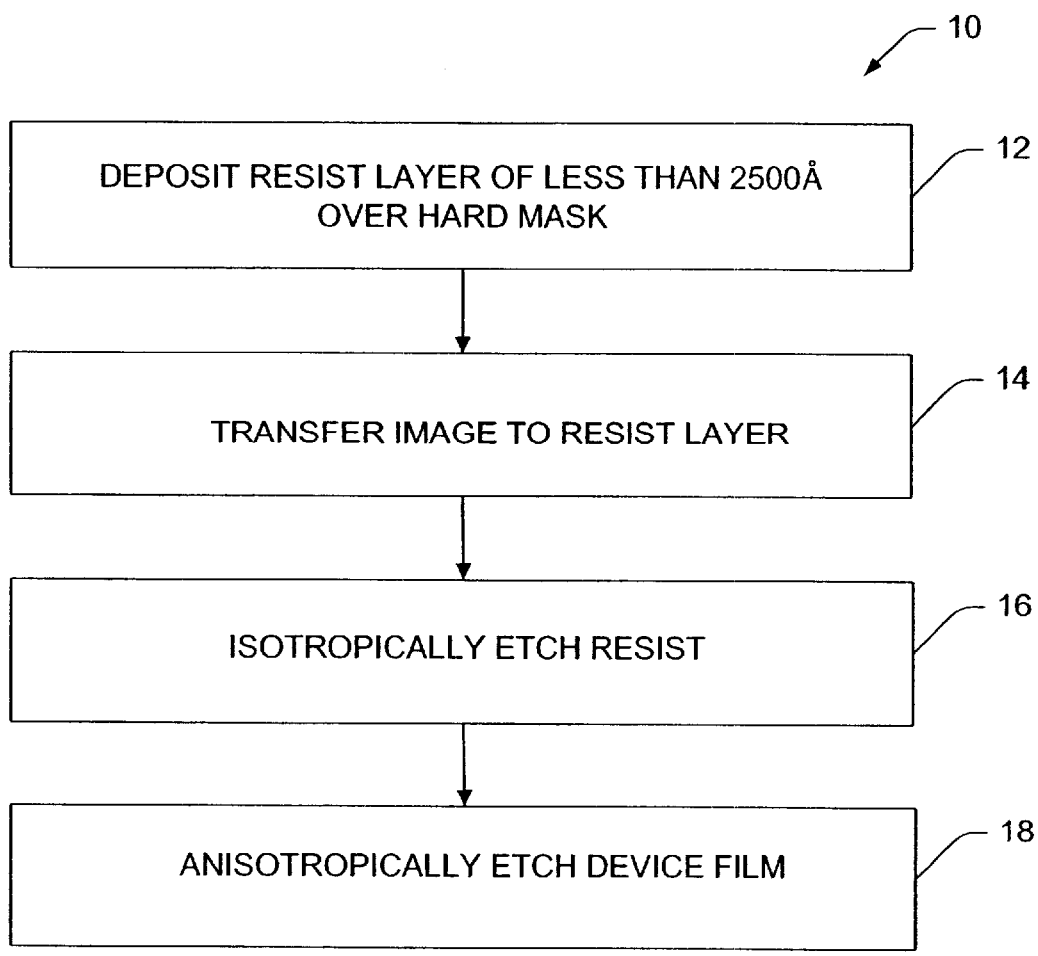
FIG. 1 is a flow diagram of a prior art trim process involving resists which are greater than 2500 Å thick.
Figure 2:
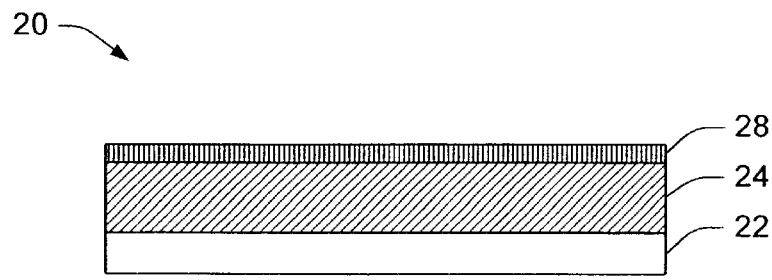
FIG. 2 illustrates a hard mask formed on a semiconductor substrate having a device film formed thereon according to the prior art flow diagram in FIG. 1.
Figure 3:
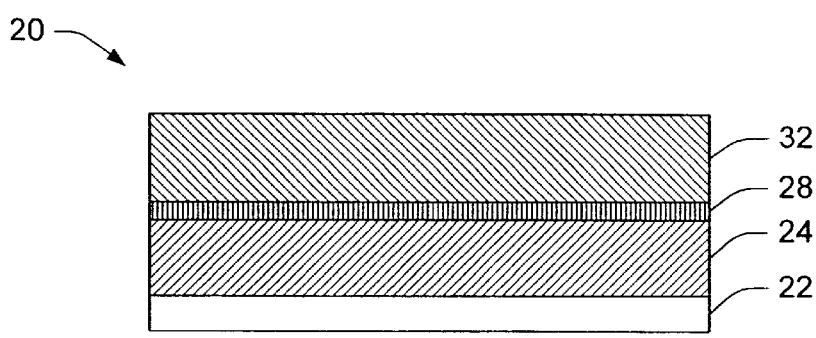
FIG. 3 illustrates an ultra thin resist formed on the structure of FIG. 2 according to the prior art flow diagram in FIG. 1.
Figure 4:
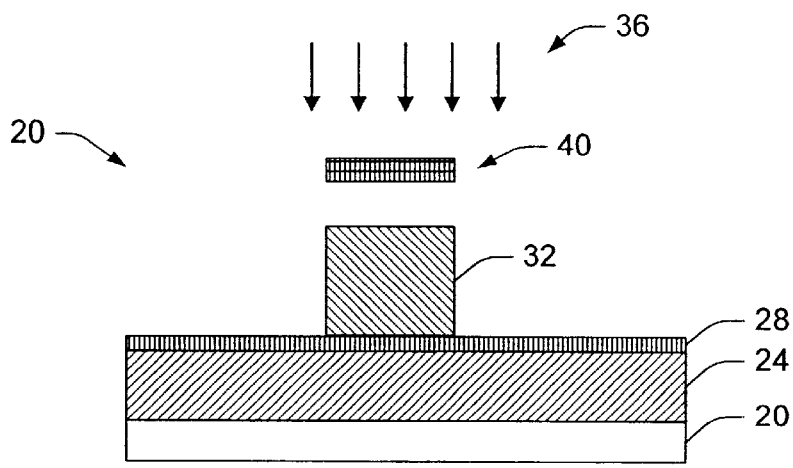
FIG. 4 illustrates the structure of FIG. 3 undergoing an etch and develop process according to the prior art flow diagram in FIG. 1.
Figure 5:
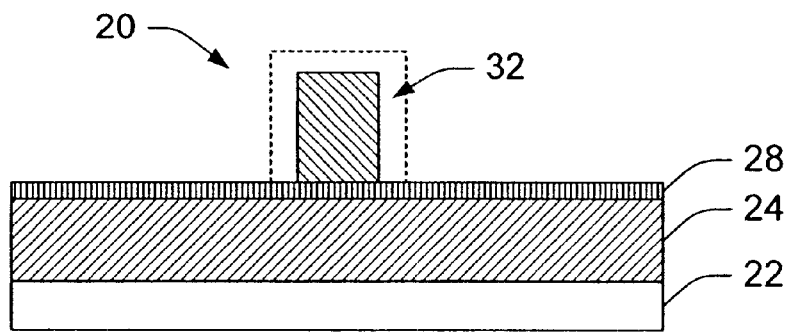
FIG. 5 a schematic illustration of the structure of FIG. 4 following an isotropic etch step of the ultra thin resist according to the prior art flow diagram in FIG. 1.
Figure 6:
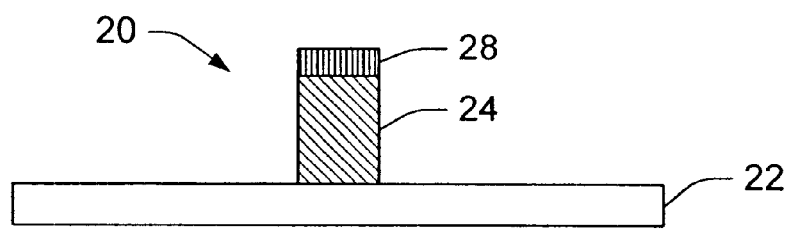
FIG. 6 a schematic illustration of the structure of FIG. 5 following the device film undergoing an anisotropic etch step according to the prior art flow diagram in FIG. 1.

The present invention will now be described with reference to the drawings, wherein like reference numerals are used to refer to like elements throughout. The method of the present invention will be described with reference to a method for reducing the linewidth of ultra thin resist structures smaller than the capability of conventional lithography technology. The following detailed description is of the best modes presently contemplated by the inventors for practicing the invention. It should be understood that the description of these aspects of the invention are merely illustrative and that they should not be taken in a limiting sense.

Figure 7:
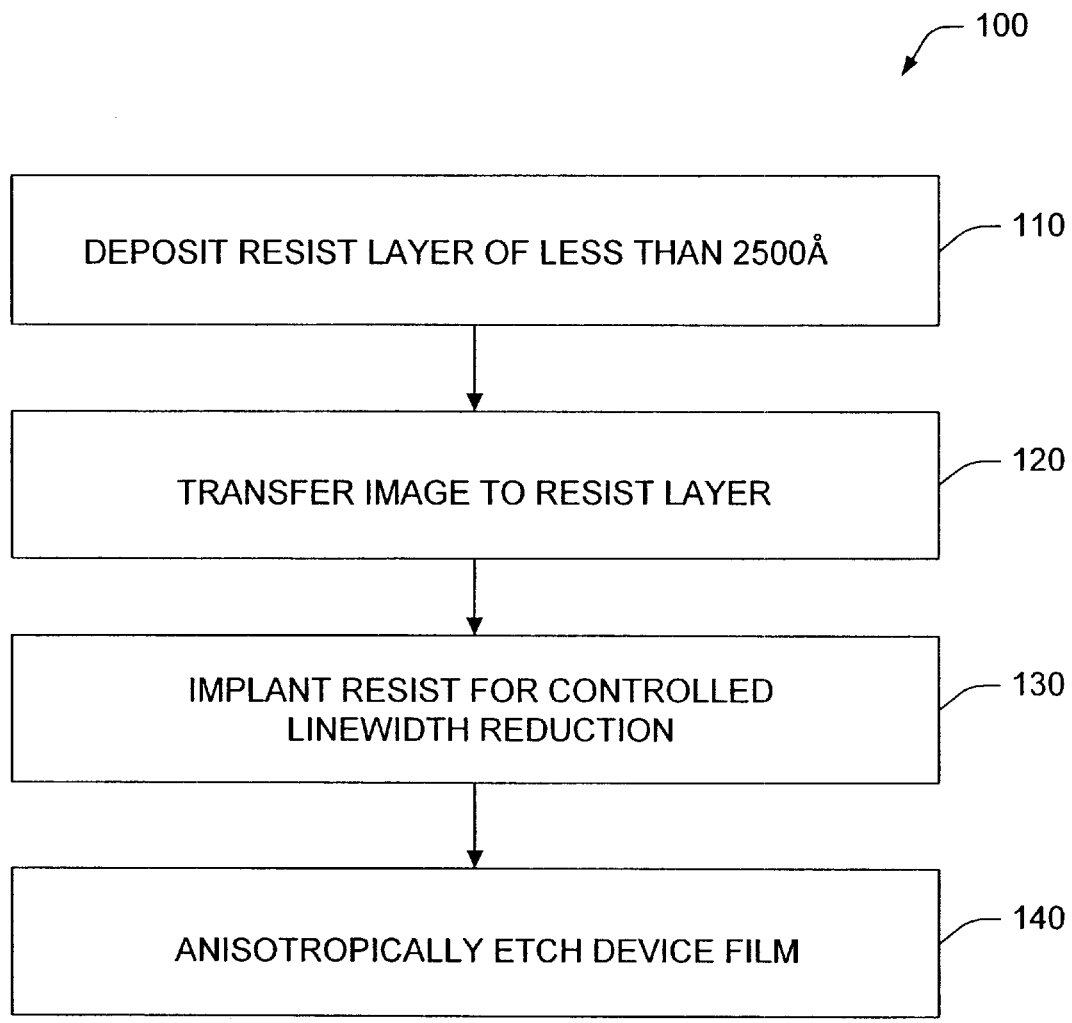
FIG. 7 is a flow diagram of a process according to one aspect of the present invention.
Figure 8:
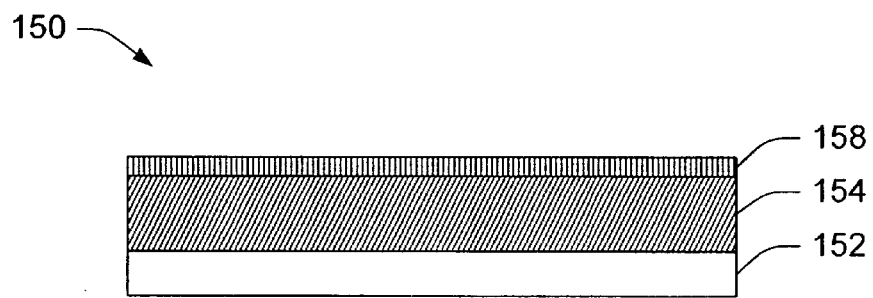
FIG. 8 illustrates a hard mask formed on a semiconductor substrate having a device film formed thereon according to one aspect of the present invention.

Referring initially to FIG. 7, one methodology for carrying out the present invention is outlined via a flow diagram. A method 100 for an ultra thin resist linewidth reduction will be described with the corresponding FIGS. 8–13. In FIG. 8, a semiconductor structure 150 is shown. The structure 150 comprises a semiconductor substrate (Si) 152, a device film layer 154 formed over the semiconductor substrate 152 and a hard mask 158 formed over the device film layer 154. The substrate 152 comprises polysilicon, however it should be appreciated that any suitable substrate may be employed to carry out the present invention.

The device film layer 154 is a conductive metal layer according to one aspect of the present invention. The conductive metal layer comprises aluminum, copper, gold, nickel, silver, tantalum, tungsten, zinc or any combination thereof. The conductive metal layer may also comprise any one of a metal alloy such as aluminum alloys, copper alloys, gold alloys, nickel alloys, silver alloys, tantalum alloys, tungsten alloys, zinc alloys or any combination thereof.

According to another aspect, the device film layer 154 is a multi-layer structure comprising one or more conductive metal layers, one or more non-conductive layers, and/or one or more dielectric layers. According to yet another aspect, the device film. layer 154 is a conductive layer comprising doped polysilicon.

The device film layer 154 may be formed over the substrate 152 using any suitable deposition technique including sputtering or chemical vapor deposition. In addition, the device film layer 154 may be of any suitable thickness depending on a desired circuit structure or on the materials used.

The hard mask 158 is formed over the device film layer 154 using any suitable deposition technique to carry out the present invention. The hard mask 158 comprises silicon oxide, oxynitride, nitride or any other organic or inorganic material which minimizes reflection of incident radiation during patterning of an ultra thin resist. The hard mask 158 is optional; thus it should be appreciated that the present invention as described herein may be carried out without employing a hard mask.

Figure 9:
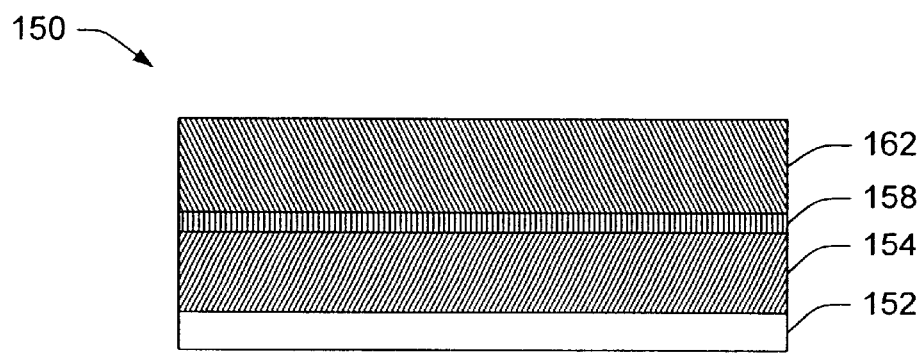
FIG. 9 illustrates an ultra thin resist formed over the hard mask according to one aspect of the present invention.

Turning now to FIG. 9, a step 110 (FIG. 7) is illustrated. At the step 110, an ultra thin resist 162 is deposited over the hard mask 158 (FIG. 9). According to one aspect of the present invention, the ultra thin resist 162 has a thickness of less than about 2500 Å. According to another aspect, the ultra thin resist 162 has a thickness of less than about 2000 Å. According to yet another aspect, the ultra thin resist 162 has a thickness of less than about 1700 Å. Deposition of the ultra thin resist 162 may occur using any suitable technique to carry out the present invention. For example, the ultra thin resist 162 may be deposited using conventional spin coating or spin casting techniques.

Figure 10:
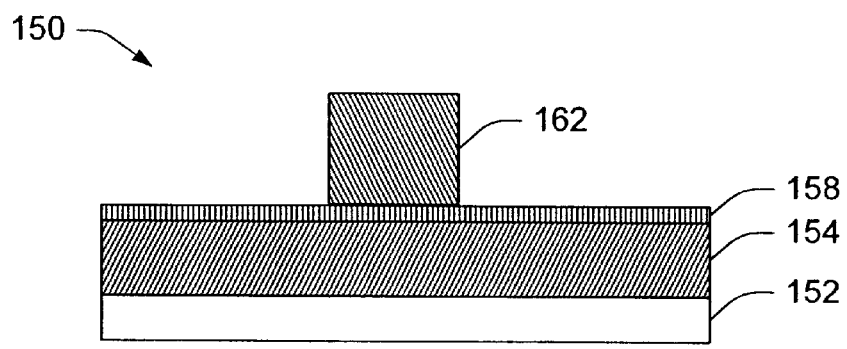
FIG. 10 illustrates the ultra thin resist undergoing an etch and develop steps according to one aspect of the present invention.

The ultra thin resist 162 is then patterned using conventional lithographic techniques (FIG. 7, step 120). It is to be appreciated that any suitable range of wavelengths be employed to carry out this aspect of the present invention, including extreme ultra-violet (EUV) radiation. In FIG. 10, the ultra thin resist 162 is shown following conventional selective etching and developing processes.

Figure 11:
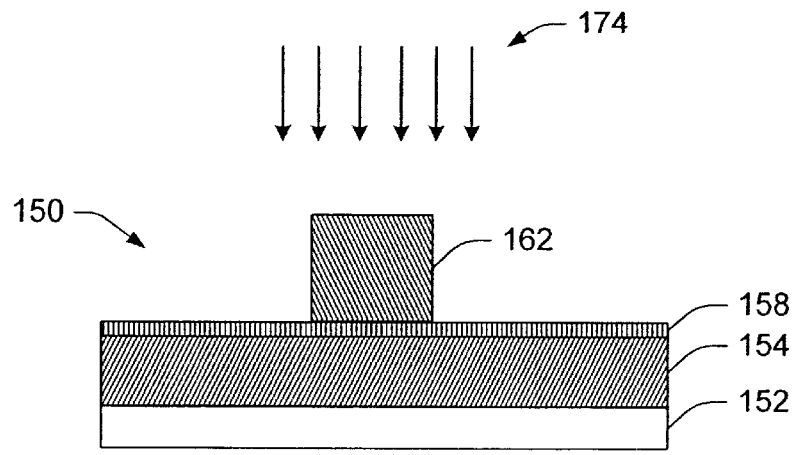
FIG. 11 illustrates the structure in FIG. 10 undergoing a densification process according to one aspect of the invention.

Turning now to FIG. 11, an implantation step 130 (FIG. 7) is shown. The ultra thin resist 162 is implanted 174 with a dopant using conventional implantation techniques. The dopant comprises any one of a neutral type species, a p-type species and an n-type species. Examples of dopants include xenon, germanium, silicon, argon and the like. Implantation may occur at any area or region of the ultra thin resist and may result in one or more dopant implanted areas or regions in the ultra thin resist. The implantation process serves to densify the ultra thin resist 162, thereby improving etch selectivity of the ultra thin resist 162 relative to an underlying layer (i.e., the device film layer 154 if no hard mask is present or the underlying hard mask 158 if a hard mask is present).

Since the amount of linewidth reduction varies with the degree of densification, implant parameters may be modified to obtain a desired amount of linewidth reduction. Implant parameters include the dopant, the dose, the degree of tilt from normal orientation (i.e., incident angle to the normal vector to the wafer plane or degree normal to the wafer plane) and the energy level employed during implantation. In particular, the implant dose range is from about $1 \times 10^{14}$ ions/cm$^2$ to about $5 \times 10^{15}$ ions/cm$^2$ of a dopant. According to one aspect of the present invention, the implant dose is about $6 \times 10^{14}$ ions/cm$^2$ of the dopant. According to another aspect, the implant dose is about $1 \times 10^{15}$ ions/cm$^2$ of a dopant. According to yet another aspect, the implant dose is about $1.5 \times 10^{15}$ ions/cm$^2$ of a dopant.

The implant dose correlates to a percentage of the ultra thin resist implanted. According to one aspect of the present invention, about 20% of the ultra thin resist is implanted with a dopant; however it should be appreciated that the percentage of resist implanted depends on the actual thickness of the resist used and the amount of linewidth reduction desired. Thus, any suitable percentage of the ultra thin resist may be implanted in accordance with the present invention.

The energy level during implantation may either be fixed or varied; however employing a fixed energy level during implantation results in fixed depths of implantation. For example, the ultra thin resist may be implanted with a dopant at an energy level range of about 1 keV to about 200 keV. A higher energy level results in a greater depth of implantation. Implantation of the ultra thin resist may also occur at an angle incident to the normal vector of the wafer plane from about 0 degrees to about 90 degrees. However, it should be appreciated that any suitable energy level and degree normal to the wafer plane may be employed to carry out the present invention.

Figure 12:
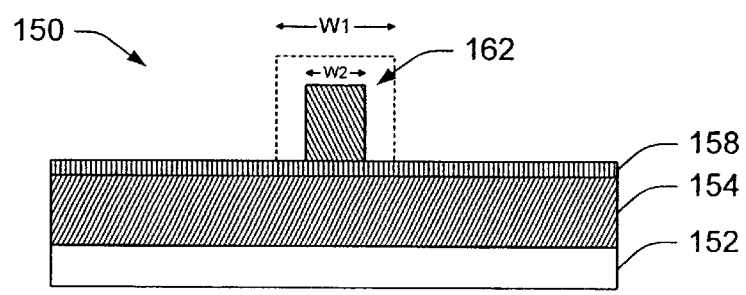
FIG. 12 is a schematic illustration of FIG. 11 following densification according to one aspect of the present invention.

Turning now to FIG. 12, the linewidth of the ultra thin resist 162 before (dashed outline) and after implantation is shown. Once implantation of the ultra thin resist 162 is substantially complete, the linewidth of the ultra thin resist 162 reduces from linewidth $W_1$ to linewidth $W_2$ as indicated in FIG. 12. Linewidth $W_1$ indicates the linewidth of the ultra thin resist 162 prior to implantation. Linewidth $W_2$ indicates the controlled reduction of the ultra thin resist 162 linewidth as a result of the implantation. Thus, implanting the ultra thin resist 162 with a dopant effectively trims the ultra thin resist linewidth without employing any conventional trim processes.

Figure 13:
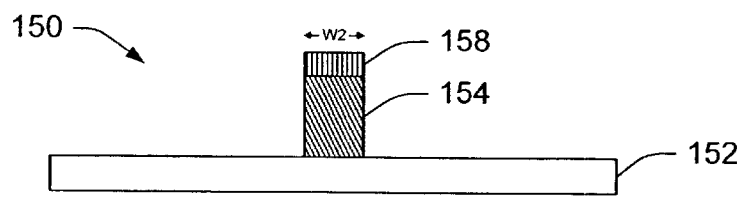
FIG. 13 is a schematic illustration the device film having undergone an etch and develop process according to one aspect of the present invention.

Following implantation, the underlying hard mask 158 and the device film layer 154 are anisotropically etched via the trimmed ultra thin resist 162 (FIG. 7, step 140). After layers 158 and 154 have been etched and developed, the structure 150 as shown in FIG. 13 is obtained. Removal of the implanted ultra thin resist 162 may be performed using a standard Plasma strip. However, any other suitable strip technique may also be employed to carry out the present invention.

Figure 17:
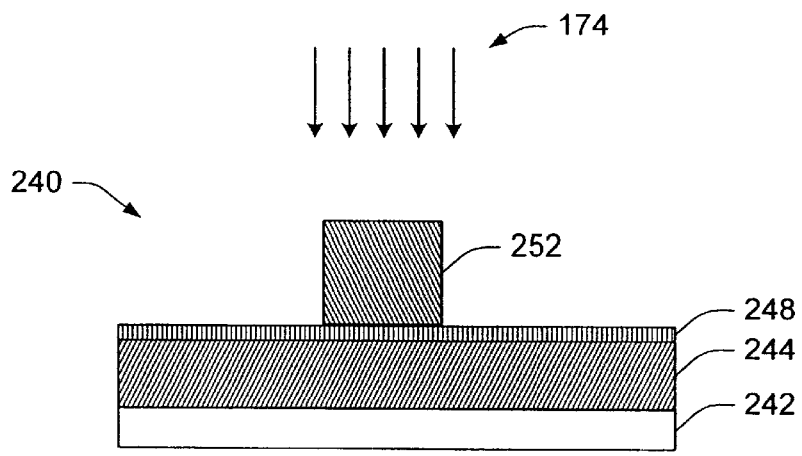
FIG. 17 illustrates the structure of FIG. 16 undergoing a densification process according to one aspect of the present invention.
Figure 18:
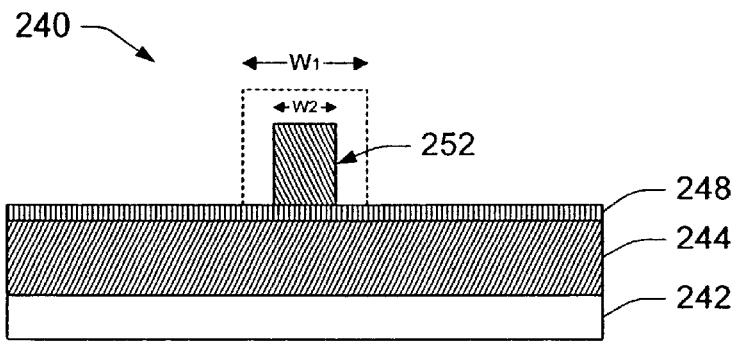
FIG. 18 is a schematic illustration of the structure of FIG. 16 following a densification process according to one aspect of the present invention.

Referring now to FIG. 14 and FIGS. 15–20, another method 180 for controlled linewidth reduction is described and illustrated, respectively. The method 180 begins with a semiconductor structure 240 substantially similar to the method 100 previously described in FIG. 7; for example, steps 190 through 210 (FIG. 14) as illustrated in corresponding FIGS. 15 through 18. After performing a step similar to the step 130 (FIG. 7) as illustrated in FIGS. 17 and 18, method 180 continues to a step 220, wherein the implanted ultra thin resist is isotropically etched and developed. Conventional trim techniques may be employed to perform the isotropic etch (trim) and development.

Figure 19:
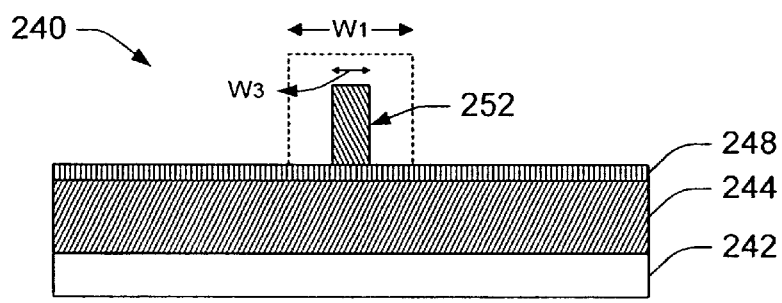
FIG. 19 is a schematic illustration of the structure of FIG. 18 following a trim process according to one aspect of the present invention.

FIG. 19 shows the implanted ultra thin resist 252 after the trim process is substantially complete. According to the structure 240 in FIG. 19, it can be seen that linewidth $W_3$ associated with the implanted and trimmed ultra thin resist 252 is significantly less than linewidth $W_2$ (FIG. 18). Thus, according to the method 180, implantation reduces the linewidth $W_1$ associated with the ultra thin resist 252 to $W_2$. Applying conventional trim techniques to the implanted ultra thin resist 252 further reduces its linewidth from $W_2$ to $W_3$.

Figure 14:
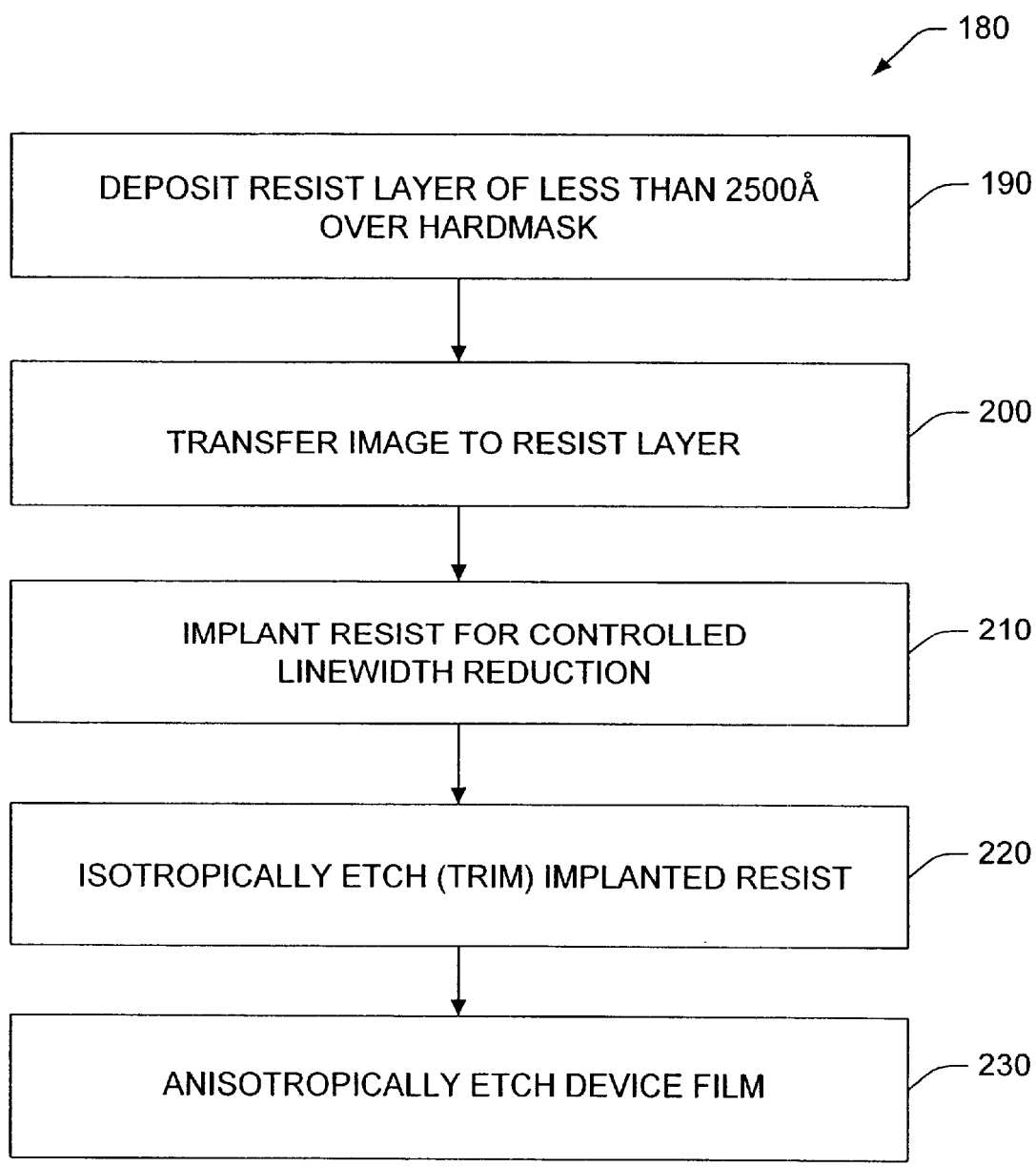
FIG. 14 is a flow diagram of a process according to another aspect of the present invention.
Figure 15:
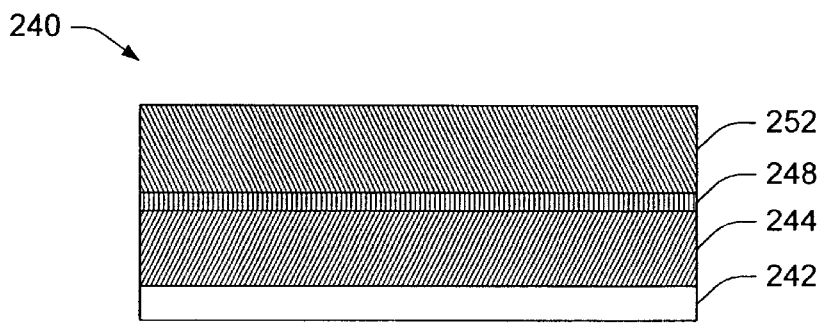
FIG. 15 is a schematic illustration of an ultra thin resist formed over a semiconductor substrate having a hard mask and a device film formed thereon according to one aspect of the present invention.
Figure 16:
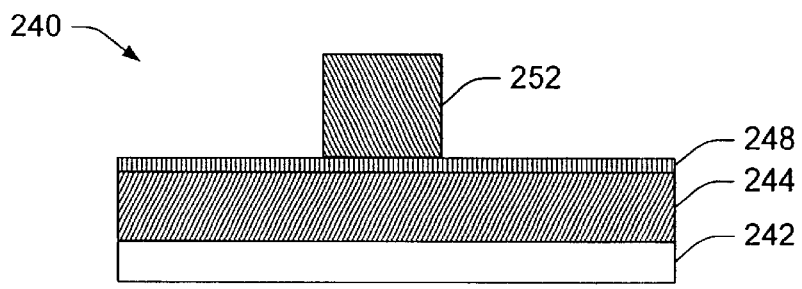
FIG. 16 illustrates the structure of FIG. 15 undergoing an etch and develop process and the structure of FIG. 15 after having undergone the etch and develop process according to one aspect of the present invention.
Figure 20:
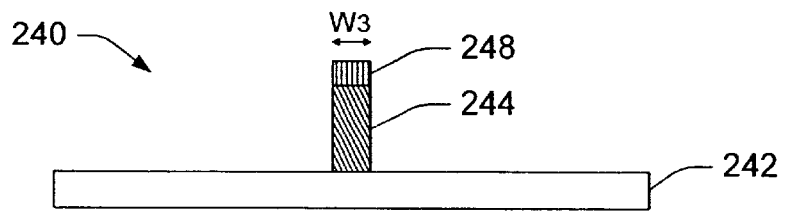
FIG. 20 is a schematic illustration of the device film and hard mask after having undergone an etch and develop process according to one aspect of the present invention.

Once the ultra thin resist 252 has been trimmed as described above, the resist 252 is used to anisotropically etch the underlying hard mask 248 and the device film layer 244 (FIG. 14, step 230). FIG. 20 illustrates the method 180 completed in relevant part, wherein the hard mask 248 and the device film layer 244 exhibit a controlled linewidth reduction from linewidth $W_1$ relative to linewidth $W_3$.

Figure 21:
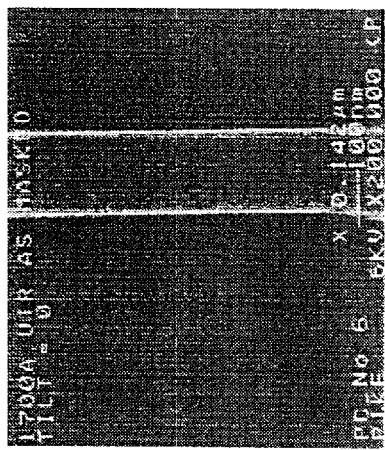
FIG. 21 is an image of an exemplary semiconductor structure according to one aspect of the present invention.
Figure 22:
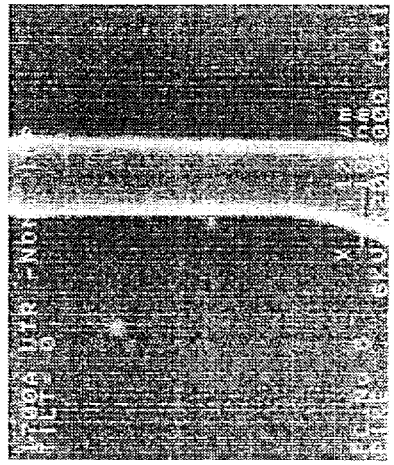
FIG. 22 is an image of an exemplary semiconductor structure according to one aspect of the present invention.
Figure 23:
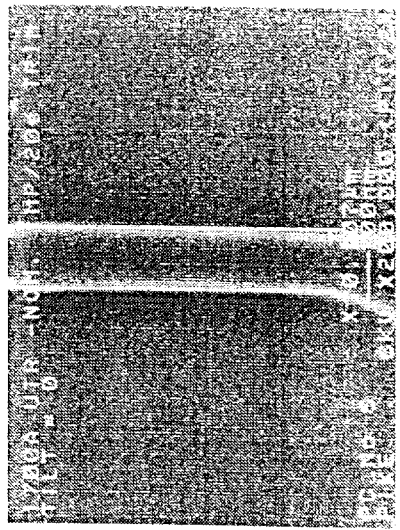
FIG. 23 is an image of an exemplary semiconductor structure according to one aspect of the present invention.

An example of the method 180 is shown in FIGS. 21 through 23. FIGS. 21 to 23 are top-view images of an ultra thin resist-clad semiconductor structure undergoing a trim process which were taken by a scanning electron microscope (SEM). In particular, FIG. 21 shows a plan view of a masked semiconductor structure on a wafer. The structure comprises a substrate, a device film layer deposited over the substrate and an ultra thin resist deposited over the device film layer.

The ultra thin resist was about 1700 Å thick and was positioned at about zero degrees normal to the wafer plane. As masked, the ultra thin resist had a linewidth of about 142 nm. Implantation with a concentration of xenon at 6 keV yielded about a 40-nm reduction of the ultra thin resist linewidth; however, the linewidth grew back about 20 nm immediately following implantation. Therefore, the net effect of the implantation was about a 20 nm-trim of the ultra thin resist linewidth. Thus, after implantation with the concentration of xenon at 6 keV, the unmasked ultra thin resist had a linewidth of about 125 nm (FIG. 22). The ultra thin resist was then subjected to a conventional 20-second resist trim process. Following the conventional trim process, the ultra thin resist linewidth was further reduced to 107 nm (FIG. 23).

Thus, as can be seen, densification of the ultra thin resist facilitates a controlled reduction in the ultra thin resist linewidth. In addition, implantation of the ultra thin resist improves the etch resistance of features associated with the ultra thin resist.

Figure 24:
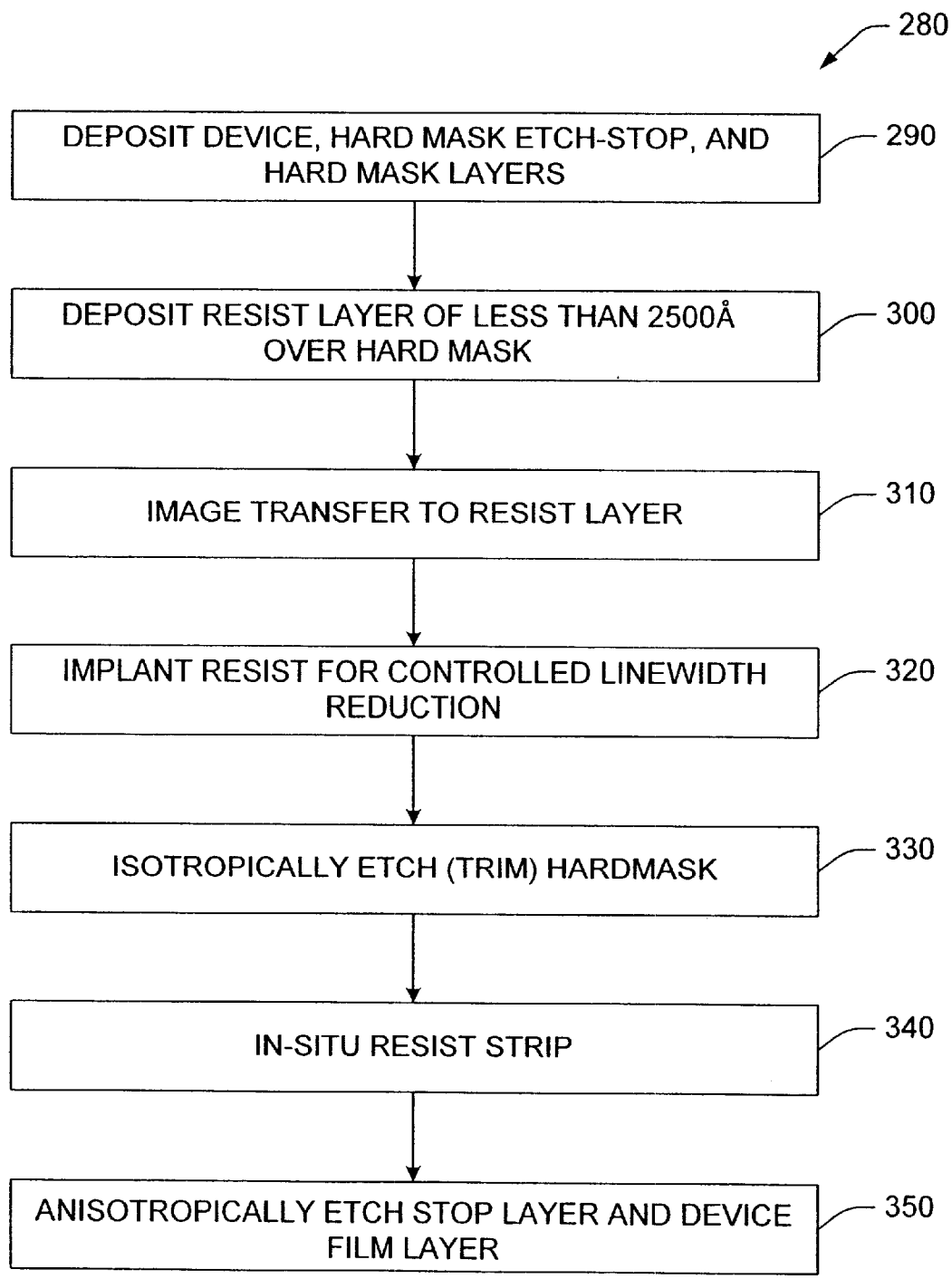
FIG. 24 is a flow diagram of a process according to one aspect of the present invention.

Turning now to FIG. 24, a flow diagram of another method 280 for controlled reduction of ultra thin resist linewidth is shown. In FIGS. 25–30, illustrations corresponding to the method 280 are also shown. The method 280 begins at a step 290, wherein a device film layer 364 is deposited over a semiconductor substrate 362, an etch stop layer 366 is deposited over the device film layer 364, and a hard mask 368 is deposited over the etch stop layer 366. The etch stop layer 366 may also be referred to as a hard mask etch stop layer.

The device film layer 364 is a conductive metal layer according to the methods 100 and 180 previously described. The etch stop layer 366 (or hard mask etch stop layer) comprises silicon nitride; however, it should be appreciated that the etch stop layer may comprise any suitable material to carry out the present invention. The hard mask 368 comprises one or more layers of an organic or inorganic hard mask material, including any metallic material, suitable to mitigate reflection of incident radiation during patterning of the ultra thin resist and to mitigate damage to layers underlying the ultra thin resist during patterning of the ultra thin resist. Deposition of the device film layer 364, the etch stop layer 366 and the hard mask 368 may be performed using any suitable deposition technique.

A bottom anti-reflective coating (BARC) may also be employed in the method 280 (not shown). The BARC may be used as an alternative, or in addition, to the hard mask 368 in order to mitigate reflection of incident radiation during patterning of the ultra thin resist and to mitigate damage to layers underlying the ultra thin resist during patterning of the ultra thin resist. In the latter circumstance, the BARC may be deposited either before or after the hard mask 368 in order to carry out the present invention. According to one aspect of the present invention, the BARC is deposited over the etch stop layer 366 (not shown).

Figure 25:
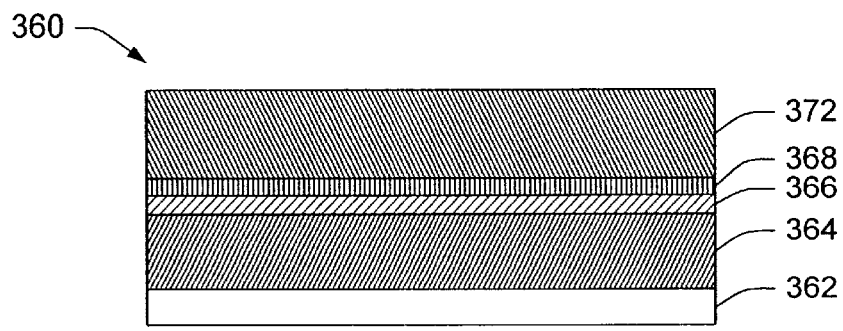
FIG. 25 is a schematic illustration of a semiconductor structure according to one aspect of the present invention.

Still referring to FIG. 24, an ultra thin resist layer 372 is deposited over the hard mask 368 at a step 300. FIG. 25 illustrates a semiconductor structure having the layers 364, 366, 368 and 372 formed over the substrate 362. According to one aspect of the present invention, the thickness of the ultra thin resist is less than about 2500 Å. According to another aspect, the thickness of the ultra thin resist is less than about 1800 Å. The ultra thin resist 372 is formed over the hard mask using suitable deposition techniques such as spin coating or spin casting.

In a step 310 associated with the method 280, the ultra thin resist 372 is etched and developed using conventional lithography techniques to reveal a desired feature pattern. A range of wavelengths similar to those employed in the method 100 and the method 180 may be used herein as well (FIGS. 7 and 14, respectively). During the etching process, the etch selectivity associated with the ultra thin resist is substantially greater than that of the underlying hard mask 368 with respect to the resist etchant. For example, the etch selectivity rate of the ultra thin resist to the underlying hard mask is about 10:1, which means that the resist etchant etches the resist about 10 times faster than the underlying hard mask material. Although the etch selectivity of the resist must be substantially greater than that of the underlying layers, it should be appreciated that any suitable etch selectivity and etchant associated with the resist may be used to carry out the present invention. As a result, the underlying hard mask 368 and hard mask etch stop layer 366 remain substantially unetched after the step 310 is completed.

Figure 26:
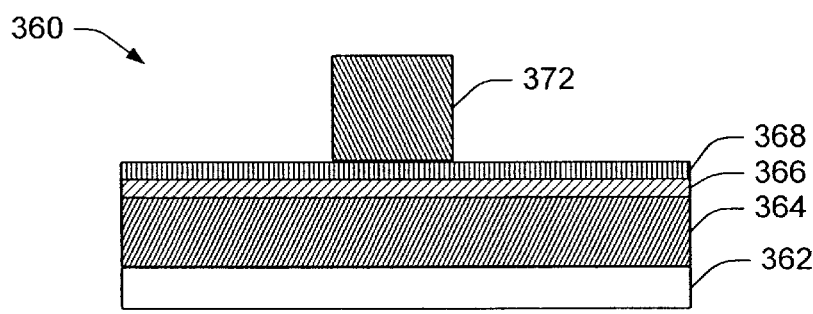
FIG. 26 illustrates the structure of FIG. 22 after having undergone an etch and develop process according to one aspect of the present invention.

FIG. 26 shows the structure 360 after the ultra thin resist 372 has been etched and developed. Following the step 310 and prior to a step 320 of the method 280, the linewidth of the ultra thin resist 372 is about $W_1$ as indicated in FIG. 23.

Figure 27:
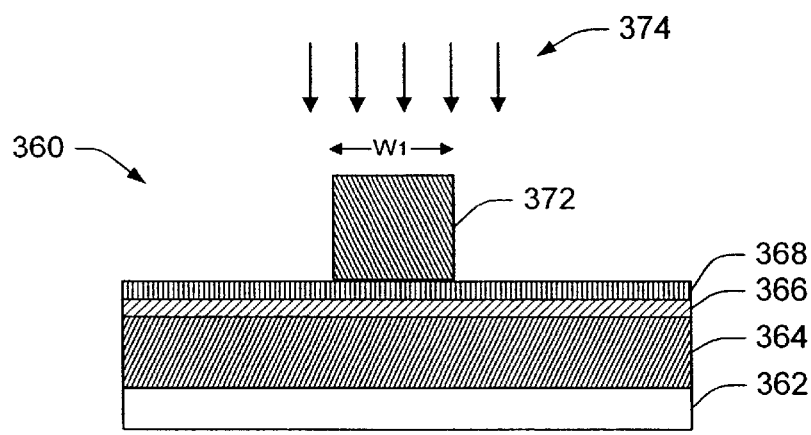
FIG. 27 illustrates the structure of FIG. 23 undergoing a densification process according to one aspect of the present invention.

At the step 320, the ultra thin resist 372 undergoes a densification process according to the implant parameters associated with the methods 100 and 180. The resist 372 is implanted 374 with a dopant comprising any one of a neutral type species, p-type species and an n-type species. Examples of suitable dopants include xenon, germanium, silicon, argon and the like. The implantation of the ultra thin resist 372 is shown in FIG. 27. As is shown, the implantation 374 densifies the ultra thin resist 372 thereby improving etch selectivity of the ultra thin resist 372 relative to the underlying layer (i.e., the device film layer if no hard mask is employed or the hard mask 368 if a hard mask is employed).

Figure 28:
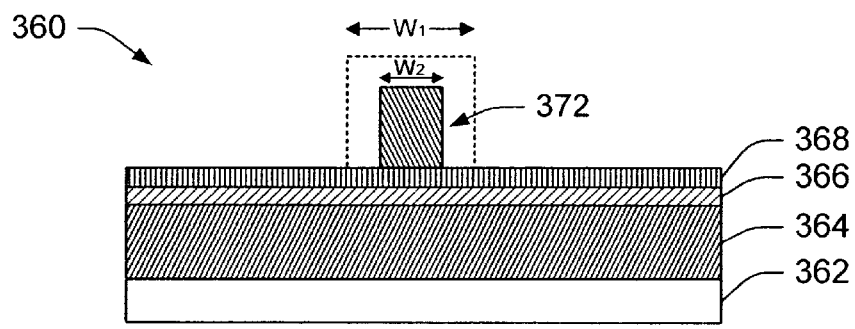
FIG. 28 is a schematic illustration of the structure in FIG. 24 after having undergone a densification process according to one aspect of the present invention.

Once implantation of the ultra thin resist 372 is substantially complete, the linewidth of the ultra thin resist 372 reduces from linewidth $W_1$ to linewidth $W_2$ as shown in FIG. 28. In particular, FIG. 28 shows the linewidth of the ultra thin resist 372 before (dashed outline) and after implantation. $W_1$ indicates the linewidth of the ultra thin resist 372 prior to implantation; and $W_2$ indicates the controlled reduction of the ultra thin resist linewidth 372 following the implantation.

Figure 29:
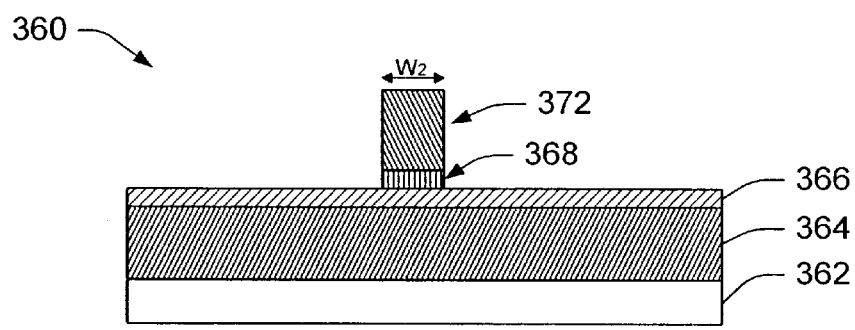
FIG. 29 is a schematic illustration of the structure in FIG. 25 after the hard mask has undergone processing according to one aspect of the present invention.

Referring again to the method 280 outlined in FIG. 24, a step 330 provides an isotropic etch of the underlying hard mask 368. The hard mask 368 has a greater etch selectivity to the isotropic etchant than both the ultra thin resist 372 and the underlying hard mask etch stop layer 366. Thus, the isotropic (trim) etch of the hard mask 368 does not substantially alter or affect the implanted ultra thin resist 372 or the underlying etch stop layer 366. The structure 360 having the trimmed hard mask 368 underlying the implanted ultra thin resist 372 is shown in FIG. 29.

In a step 340, the ultra thin resist 372 is stripped or removed from the structure 360. Removal of the resist 372 may occur in-situ the semiconductor fabrication process using a standard Plasma strip. Any other suitable strip technique may be employed to carry out the present invention. Upon removal of the resist, the hard mask etch stop layer 366 and the device film layer 364 are anisotropically etched and developed.

Figure 30:
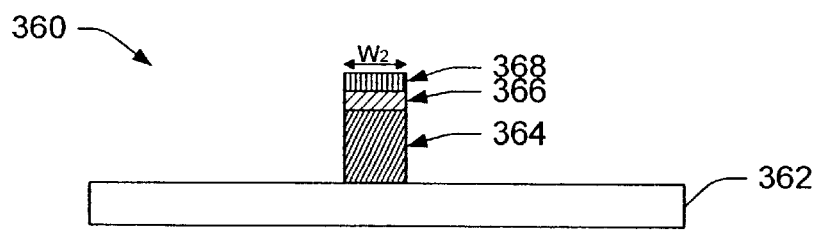
FIG. 30 is a schematic illustration of the structure in FIG. 26 after having undergone lithography processing according to one aspect of the present invention.

FIG. 30 illustrates the structure 360 substantially complete according to the method 280 of the present invention.

As can be seen from FIG. 30, the linewidth of the feature comprising the hard mask 368, the hard mask etch stop layer 366 and the device film layer 364 has undergone a controlled reduction. It should be appreciated that the structure 360 could also be subjected to the method 180, wherein the ultra thin resist is trimmed via an isotropic etch step to further reduce the linewidth of the ultra thin resist and hence further reduce the linewidth of the desired semiconductor feature.

Figure 31:
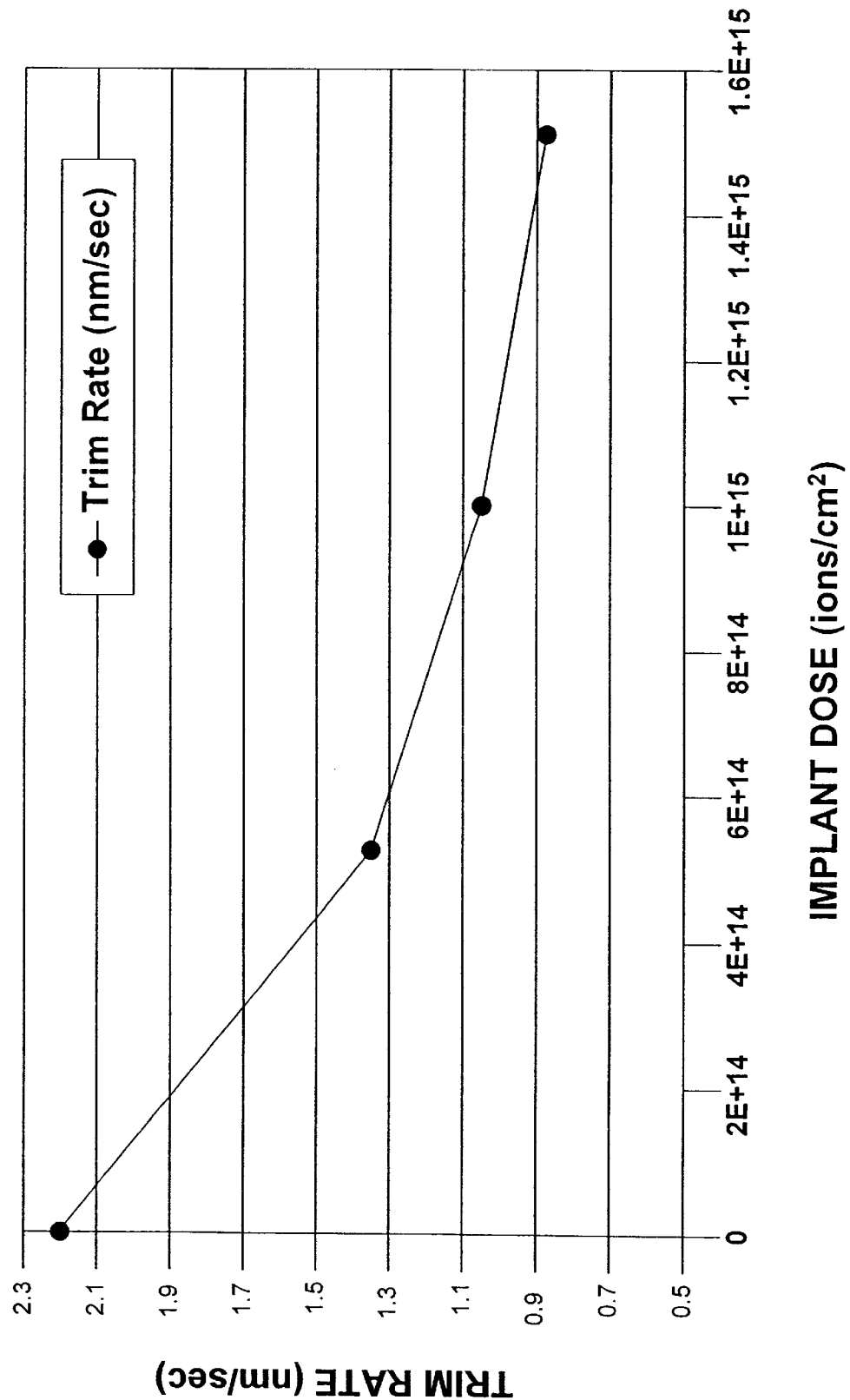
FIG. 31 is an exemplary line graph depicting trim rate in relation to an implant dose associated with a densification process according to one aspect of the present invention.

Turning now to FIG. 31, a line graph demonstrating a trim rate in relation to an implant dose of any one of a dopant including xenon, germanium, argon, silicon and the like is shown. The data represented in FIG. 31 were based on implant doses of xenon but the data is representative of any one dopant including neutral types, p-types, and n-types. According to the figure, the trim rate associated with an ultra thin resist decreases as the implant dose increases, thereby allowing for a controlled reduction of the ultra thin resist linewidth.

Although the invention is primarily described within the context of integrated circuit fabrication, it is to be appreciated that the present invention has wide applicability to many areas such as, for example, package interconnects, multi-chip module interconnects, and printed circuit board interconnects. What has been described above are preferred aspects of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method for making a semiconductor structure exhibiting controlled linewidth reduction comprising:
   depositing an ultra thin resist onto a semiconductor substrate having a device film layer formed thereon;
   patterning an image onto the ultra thin resist, the image having at least a first linewidth;
   implanting the ultra thin resist with a dopant, wherein implanting the ultra thin resist with the dopant causes the ultra thin resist to undergo a densification process which facilitates a controlled reduction of the ultra thin resist linewidth associated with an ultra thin resist feature; and
   anisotropically etching the patterned image into the device film layer, the patterned image having a second linewidth less than the first linewidth.

2. The method of claim 1, wherein a degree of densification determines an amount of linewidth reduction.

3. The method of claim 2, wherein the degree of densification depends upon implant parameters including dopant, dose, incident angle to a normal vector of a wafer plane and energy.

4. The method of claim 3, wherein the ultra thin resist is implanted with the dopant at an energy level from about 1 keV to about 200 keV and at an incident angle to the normal vector to the wafer plane from about 0 degrees to about 90 degrees.

5. The method of claim 1, wherein the ultra thin resist is less than about 2500 Å thick.

6. The method of claim 1, wherein the dopant comprises one of a neutral type species, a p-type species, and an n-type species.

7. The method of claim 6, wherein the dopant comprises any one of xenon, germanium, silicon and argon.

8. The method of claim 1, wherein the ultra thin resist is implanted with the dopant species at a dose from about $1 \times 10^{14}$ ions/cm$^2$ to about $5 \times 10^{15}$ ions/cm$^2$.

9. The method of claim 1, wherein a hard mask is formed over the device film prior to deposition of the ultra thin resist.

10. The method of claim 9, wherein the hard mask comprises an organic or inorganic material.

11. The method of claim 9, wherein the hard mask comprises one of silicon oxide and silicon nitride.

12. A method for forming a semiconductor structure exhibiting controlled linewidth reduction comprising:

depositing an ultra thin resist onto a semiconductor substrate having a device film layer formed thereon;

patterning an image onto the ultra thin resist, the image having at least a first linewidth;

implanting the ultra thin resist with a dopant, wherein implanting the ultra thin resist with the dopant causes the ultra thin resist to undergo a densification process which facilitates a controlled reduction of the ultra thin resist linewidth associated with an ultra thin resist feature;

isotropically etching the implanted ultra thin resist; and anisotropically etching the patterned image into the device film layer, the patterned image having a second linewidth less than the first linewidth.

13. The method of claim 12, wherein a degree of densification determines an amount of linewidth reduction.

14. The method of claim 13, wherein the degree of densification depends upon implant parameters including species, dose, incident angle to a normal vector of a wafer plane and energy.

15. The method of claim 14, wherein the ultra thin resist is implanted with the dopant at an energy level from about 10 keV to about 180 keV and at an incident angle to the normal vector of the wafer plane from about 40 degrees to about 80 degrees.

16. The method of claim 12, wherein the ultra thin resist is about less than 2500 Å thick.

17. The method of claim 12, wherein the dopant comprises one of a neutral type species, a p-type species, and an n-type species.

18. The method of claim 12, wherein the dopant comprises any one of xenon, germanium, silicon and argon.

19. The method of claim 12, wherein the ultra thin resist is implanted with the dopant species at a dose from about $5 \times 10^{14}$ ions/cm$^2$ to about $1 \times 10^{15}$ ions/cm$^2$.

20. The method of claim 12, wherein a hard-mask is formed over the device film layer, the hard mask comprising any one of silicon oxide, silicon nitride and oxynitride.

21. A method for forming a semiconductor structure exhibiting controlled linewidth reduction comprising:

depositing an ultra thin resist onto a semiconductor substrate having a device film layer formed thereon, an etch stop layer formed over the device film layer and a protective layer formed over the etch stop layer;

patterning an image onto the ultra thin resist, the image having at least a first linewidth;

implanting the ultra thin resist with a dopant, wherein implanting the ultra thin resist with the dopant causes the ultra thin resist to undergo a densification process which facilitates a controlled reduction of the ultra thin resist linewidth associated with an ultra thin resist feature;

isotropically etching the protective layer;

anisotropically etching the patterned image into the etch stop layer, the patterned image having a second linewidth less than the first linewidth; and anisotropically etching the patterned image into the device film layer.

22. The method of claim 21, wherein a degree of densification determines an amount of linewidth reduction.

23. The method of claim 22, wherein the degree of densification depends upon implant parameters including dopant, dose, incident angle to a normal vector of a wafer plane and energy level.

24. The method of claim 23, wherein the ultra thin resist is implanted with the dopant species at an energy level from about 120 keV to about 160 keV and at an incident angle to the normal vector to the wafer plane from about 50 degrees to about 70 degree.

25. The method of claim 21, wherein the ultra thin resist is less than about 2500 Å thick.

26. The method of claim 21, wherein the dopant comprises one of a neutral type species, a p-type species, and an n-type species.

27. The method of claim 21, wherein the dopant comprises any one of xenon, geranium, silicon and argon.

28. The method of claim 21, wherein the ultra thin resist is implanted with the dopant species at a dose from about $1 \times 10^{15}$ ions/cm$^2$ to about $1.5 \times 10^{15}$ ions/cm$^2$.

29. The method of claim 21, wherein the protective layer comprises one or more layers of an organic or inorganic bard mask material.

30. The method of claim 29, wherein the hard mask material mitigates reflection of incident radiation during patterning of the ultra thin resist and mitigates damage to layers underlying the ultra thin resist during patterning of the ultra thin resist.

31. The method of claim 29, wherein one layer associated with the protective layer is a bottom anti-reflective coating (BARC).

32. A method for forming a semiconductor structure on a wafer exhibiting controlled linewidth reduction comprising:

depositing an ultra thin resist onto a semiconductor substrate having a device film layer formed thereon, an etch stop layer formed over the device film layer and a protective layer formed over the etch stop layer;

patterning an image onto the ultra thin resist, the image having at least a first linewidth;

implanting the ultra thin resist with a neutral-type dopant at an energy level of 6 keV and at 60 degrees normal to the wafer plane, wherein implanting the ultra thin resist with the dopant causes the ultra thin resist to undergo a densification process which facilitates a controlled reduction of the ultra thin resist linewidth associated with an ultra thin resist feature;

isotropically etching the protective layer;

anisotropically etching the patterned image into the etch stop layer, the patterned image having a second linewidth less than the first linewidth; and anisotropically etching the patterned image into the device film layer.

33. The method of claim 32, wherein the energy level is fixed.

34. The method of claim 32, wherein the neutral-type dopant is xenon.

35. The method of claim 34, wherein xenon is implanted at a concentration from about $1 \times 10^{15}$ ions/cm$^2$ to about $3.25 \times 10^{15}$ ions/cm$^2$.

* * * * *